Sept. 20, 1966 K. A. PULLEN, JR 3,274,462
STRUCTURAL CONFIGURATION FOR FIELD-EFFECT AND JUNCTION TRANSISTORS
Filed Nov. 13, 1963 3 Sheets-Sheet 1
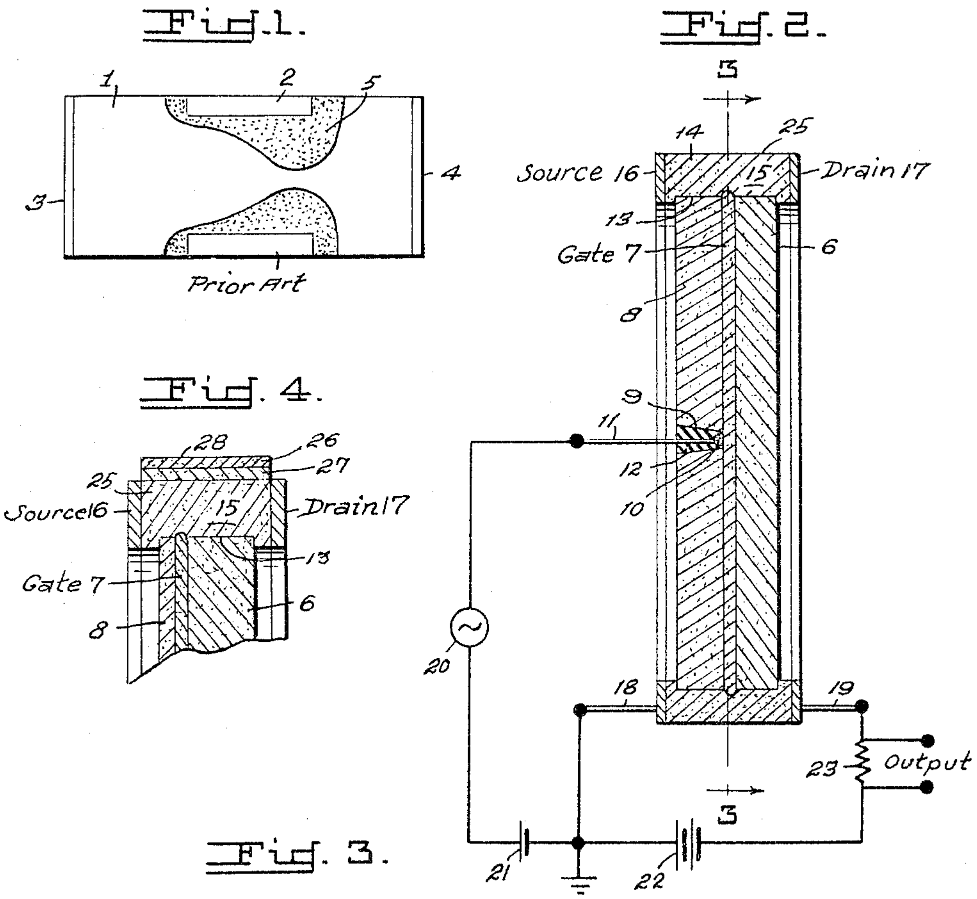
FIG. 1. FIG. 2. FIG. 4. FIG. 3.
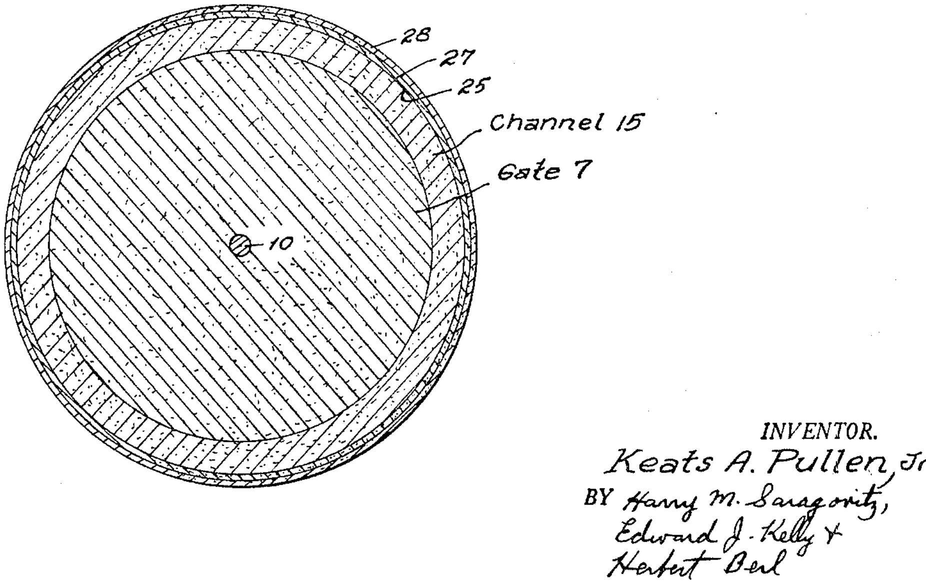
INVENTOR.
Keats A. Pullen, Jr.
BY Harry M. Saragovitz,
Edward J. Kelly &
Herbert Berl INVENTOR.
Keats A. Pullen, Jr.
BY Harry M. Saragovitz,
Edward J. Kelly &
Herbert Berl INVENTOR.
Keats A. Pullen, Jr.
BY: Harry M. Saragovitz, Edward J. Kelly & Herbert Berl

United States Patent Office 3,274,462

Patented Sept. 20, 1966

3,274,462

STRUCTURAL CONFIGURATION FOR FIELD-EFFECT AND JUNCTION TRANSISTORS

Keats A. Pullen, Jr., Rte. 1, Box 381, Kingsville, Md.

Filed Nov. 13, 1963, Ser. No. 323,511
2 Claims. (Cl. 317—235)

The invention described herein may be manufactured and used by or for the Government for governmental purposes, without the payment to me of any royalty thereon.

This invention relates to field-effect transistors and more particularly to a new and novel structural configuration for field-effect and junction transistors.

The operation of a field-effect transistor depends upon the modulation of the resistance of the current path or channel through a semiconductor of one conductivity between two contacts called the source and the drain which are affixed to opposite ends of the aforementioned semiconductor. This modulation is obtained by means of a semiconductor of opposite conductivity, called the gate, positioned in or around the semiconductor of one conductivity between the source and drain. When the junctions, formed by the semiconductors of opposite conductivity, limiting the channel, are biased in the reverse direction the cross section of the channel within the limits of the gate is modulated by the penetration of the depletion layer at the junctions and when the reversed bias is sufficiently large so as to cause the depletion layers to join, the channel conductivity between the source and drain drops essentially to zero. Conventional field-effect transistors are inefficient in that the thickness of the channel region under the gate is very difficult to control resulting in difficulty in control of the current flow; the control region is long whereby the frequency characteristics are poor; the lineal length of the control area is small laterally and this thickness is variable; and, in addition, the structure is of such dimensions that its capacitance is large.

An object of the invention is a field-effect transistor wherein the control region is short in the direction of current flow in order to maintain maximum frequency response.

Another object of the invention is a field-effect transistor of such physical structure as to keep the basic conducting regions sharply limited in dimension whereby detrimental inter-terminal capacitances are minimized.

A still further object of the invention is a field-effect transistor wherein the gate width is both uniform and minimum in order to minimize the amount of flow of uncontrollable current.

The invention will be understood more clearly from the following detailed description taken in connection with the accompanying drawings, in the several figures of which like numerals identify like elements, and in which:

FIGURE 1 is a schematic diagram illustrating a conventional field-effect transistor;

FIGURE 2 shows one embodiment of the invention, in cross section, with an appropriate circuit;

FIGURE 3 is a cross sectional view taken along the line 3—3 of FIGURE 2;

FIGURE 4 shows another embodiment, in fragmentary cross section, of the invention;

Figure 5:
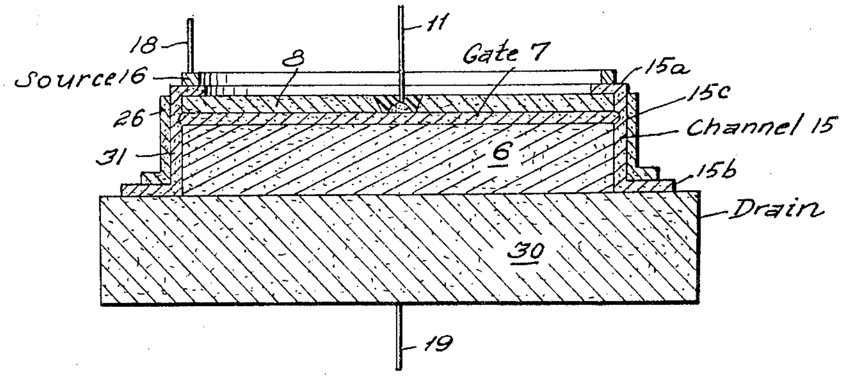
FIGURE 5 is a cross sectional view of another embodiment of the invention wherein a mesa-type structure is included.

It will be appreciated that the representations in the drawings are exaggerated in dimensions to facilitate a clearer understanding of the invention. The field-effect transistor shown in FIGURE 1 illustrates the deficiencies of the conventional field-effect transistor. It comprises a block 1 of N-type germanium, which is known as the channel. Around the center of block 1 a P-type germanium section 2 is formed which is called the gate. The ohmic contact 3 and ohmic contact 4 are known as the source and drain, respectively. Numeral 5 indicates the depletion areas. As can be seen by inspection of FIGURE 1, the control region under the gate 2 is long and as a result the frequency characteristics are poor; the lineal length of the control area is small laterally; and the thickness of the channel region under the gate 2 is very difficult to control in manufacture to such a degree that much of the current-flow is difficult to control. In addition the structure is such that the capacitances are relatively large.

The basic form of my field-effect transistor is shown in FIGURE 2. The structure shown in FIGURE 2 overcomes the aforementioned deficiencies and consists of disc 6 of intrinsic semiconductor, the diameter of which may be between 0.02 and 0.5 inch or more and its thickness may range from a few thousandths to 0.025 inch. The initial step, using one method of manufacture, is to diffuse one face of the disc 6 with a polar impurity so as to form typically an N-type germanium layer 7 which comprises the gate. Alternatively, semiconductor material containing impurity may be epitaxially deposited. Then a single crystal intrinsic semiconductor 8 is grown on layer 7. One method of growing the single crystal intrinsic semiconductor 8 to the diffused surface of disc 7 is by vacuum deposition. In line with the center of the disc a lead well 9 is etched through the intrinsic semiconductor 8 down to a point almost in contact with the diffused layer 7 which comprises the gate and then an ohmic contact 10 is developed to the diffused layer 7 and a gate lead 11 attached to the ohmic contact 10. The lead well 9 is then filled with an insulating material 12. The peripheral edge 13 of the composite disc, comprising the disc of intrinsic semiconductor 6 with the diffused layer of N-type material 7 and the intrinsic semiconductor layer 8, is diffused with an opposite type of impurity 14. In the instant case the opposite type of impurity 14 is a P-type germanium semiconductor and constitutes the channel 15 for the subject transistor. It is to be understood that the elements forming the gate and channel may be of P-type semiconductor and N-type semiconductor, respectively, as well as N-type and P-type, respectively. It is important that the surface created by diffusing the impurity 14 be dense enough to cause all of the surface of the peripheral edge 13 to have the same polarity of net impurity. An annular ohmic contact 16, the source, and an annular ohmic contact 17, the drain, are alloyed or otherwise suitably secured to opposite faces or edges of channel 15. Source lead 18 and drain lead 19 are attached to the respective ohmic contacts. Another way of forming the assembly of my field-effect transistor is to diffuse one surface of each of two intrinsic germanium semiconductor discs or blocks with a polar impurity. A hole for the gate lead is then drilled through one of the discs after which the two discs are placed on one another with the diffused surfaces in contact. This assembly is then heated sufficiently to cause the diffused surfaces to fuze together and then the reverse polarity impurity is applied to the peripheral surface, either by diffusion or by epitaxial deposit. The source and drain ohmic contacts and the gate lead are developed as described in conjunction with FIGURE 2.

With reference to FIGURE 2, numeral 20 indicates the signal source which is in series with gate battery 21, the signal being applied across the gate and source. The battery 22 which is the potential source for the drain has one terminal connected to the drain through the load resistor 23 across which the output signal is developed and its other terminal returned to junction 24 formed by the gate battery 21 and source lead 18.

Surface layers of semiconductor material unless very carefully treated to prevent it, generate excessive amounts of electrical noise. A way of inactivating the peripheral surface 25 of my field-effect transistor and thereby eliminating electrical noise due to imperfections in the peripheral surface 25 and due to effects of contamination is shown in FIGURE 4. The inactivation of the peripheral surface 25 is obtained by diffusion of N-type germanium semiconductor 26 on the surface 25 of the P-type germanium semiconductor forming channel 15. The diode barrier 27 created by the aforementioned diffusion prevents electrical noise generated on the outer surface 28 of the N region 26 from effecting channel 15. Among other important features of the invention is the reduction in the control area of the gate. The object of the reduction in the control area is to keep the control region in the direction of current flow from the source to the drain as short as physically possible in order to obtain maximum frequency response. The actual thickness of the control region, determined by the thickness of the gate, is not susceptible of illustration in the drawings, its dimension being in the magnitude of 0.00003 inch. It is also necessary to keep the gate width both uniform and minimum in order to minimize the amount of uncontrollable current flow.

Figure 6:
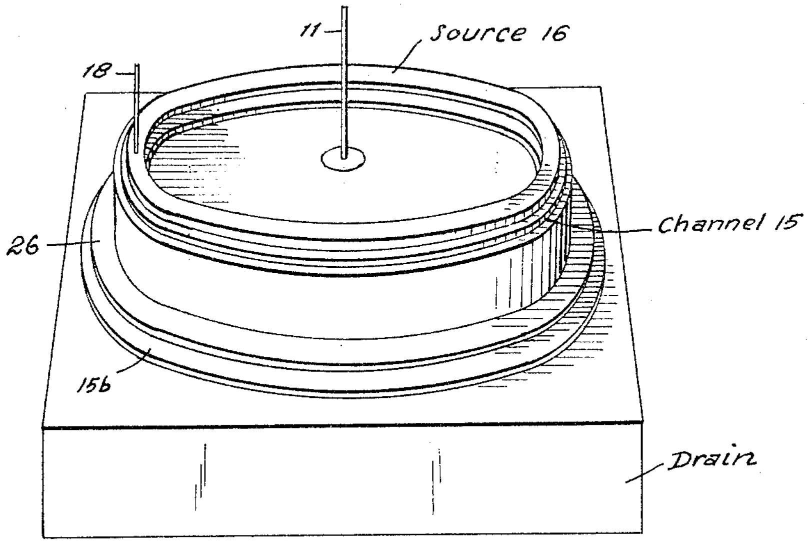
FIGURE 6 is a perspective view of the field-effect transistor employing the mesa-type structure.

Further, it has been found that by locating the gate 7, FIGURES 4, 5 and 6, immediately adjacent to source 16, the value of the resistance in the channel between source 16 and control area of gate is effectively reduced whereby a considerable increase in conductance is obtained. Although the value of resistance in the channel between the gate control area and the drain will then be much greater, it is insignificant in view of the fact that the output load resistance is much greater in magnitude.

Figure 7:
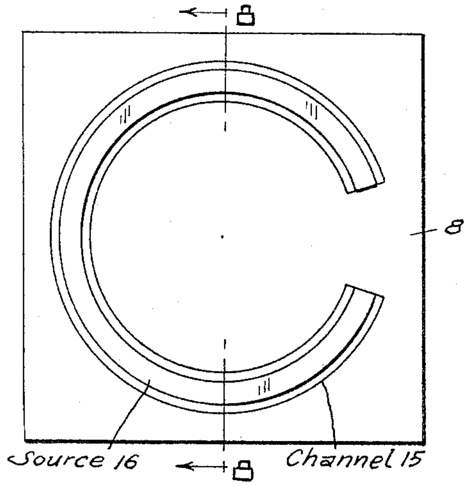
FIGURE 7 is a plan view of another embodiment of the invention.
Figure 8:
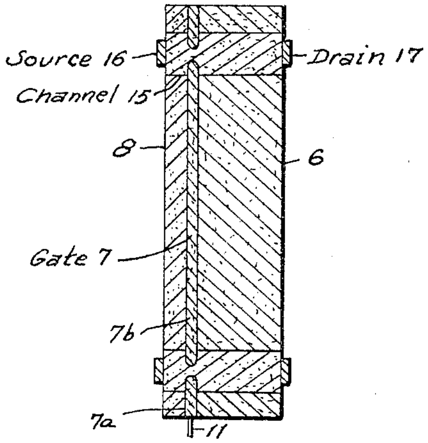
FIGURE 8 is a cross sectional view taken along line 7—7 of FIGURE 7.
Figure 9:
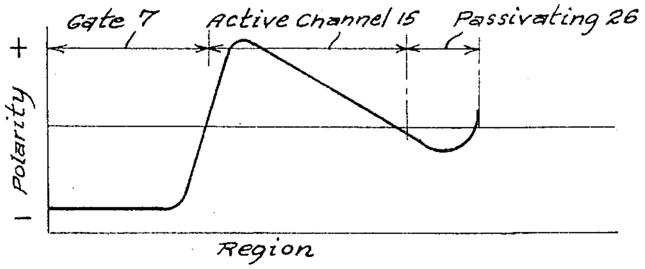
FIGURE 9 is a graph showing the polar density distribution in the plane of the gate of the field-effect transistor.
Figure 10:
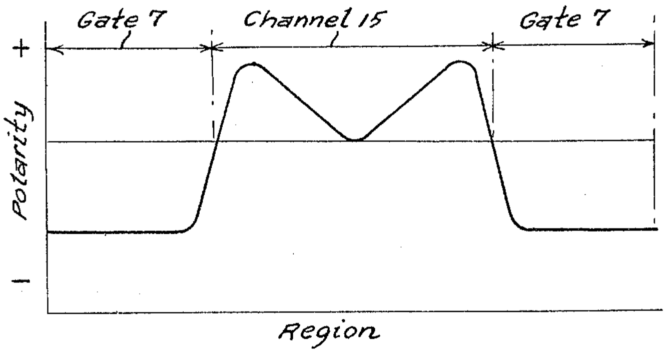
FIGURE 10 is a graph showing the polar density distribution when a two-sided gate control is employed.

FIGURES 7 and 8 illustrate another form of my field-effect transistor particularly with reference to the channel 15. With the exception of channel 15, this embodiment of the transistor is formed basically as described in connection with FIGURE 2 wherein 6 is an intrinsic semiconductor having one face diffused with a polar impurity comprising the gate 7 which has a single crystal intrinsic semiconductor 8 grown on its exposed surface. The channel 15 is produced by diffusing in the intrinsic semiconductor from the drain and source sides of the transistor a line contour of doping material. Although the line contour forming the channel is shown to be circular in shape, it may be of any configuration. On the drain side of the transistor the diffusion process is continued until the diffusant just reaches the gate region and commences to convert it to opposite polarity. At this point this diffusion is stopped in order that the diffusion from the source side may be used to cause penetration of the gate region whereby channel 15 is formed. The diffusion through the gate region should be accomplished from the side of the transistor which permits reaching the gate with minimum penetration of the intrinsic semiconductor, which in FIGURE 6 is the source side of the transistor. This is necessary so that the final properties of channel 15 through the gate may be more precisely controlled. The channel 15 of the embodiment shown in FIGURES 7 and 8 is in the form of an open annulus, a 315 degree section, whereby regions **7*a* and 7*b* of the gate 7** exert control action on the depletion areas. Although only diffusion techniques have been discussed in the foregoing descriptions of my field-effect transistor, it is to be understood that epitaxial growth techniques may also be employed. For example, the gate and channel regions in FIGURES 1–8 of the drawings may be formed by epitaxial growth techniques. The formation of the channel by epitaxial growth has particular advantages, in that the channel can then have high doping level adjacent to the active gate and a decreasing level of doping as the layers away from the gate are reached as shown in FIGURE 9 which illustrates the polar density distribution in the plane of the gate of the field-effect transistor shown in FIGURE 4. Moreover, my field-effect transistor includes an M-shaped polar distribution where the active gate region is applied on both sides of the channel and the thickness of the channel in the gate region can be significantly less critical. The M-shaped polar distribution in the channel results in the channel conductivity being maximum adjacent to each of the gates with most of the current being limited to the regions adjacent the depletion areas whereby the effect of the variation of channel width is minimized.

FIGURES 5 and 6 illustrate a mesa-type embodiment of the invention wherein reference numeral 30 indicates a low-resistivity substrate providing a structural support upon which is deposited a layer of intrinsic semiconductor 6, the diameter of which is less than the width of substrate 30. The thickness of the layer comprising gate 7 is in the order of microns or less and consists of one type of polar impurity, i.e. N-type semiconductor, diffused in a surface of the intrinsic layer 6 thereby forming a polarized surface thereon. The gate 7 may also be epitaxially deposited on layer 6. A layer of single crystal semiconductor 8 of thickness less than a few microns is grown on the polarized surface, for example, by means of vacuum deposition. The assembly comprising layers 6, 7 and 8 has an annular surface 31 upon which is epitaxially deposited material of opposite polarity, i.e. P-type semiconductor, forming the channel 15, in such a manner that an inwardly directed flange **15*a* is formed embracing the layer 8 and outwardly directed flange 15*b* is formed on substrate 30. The conductivity distribution in the channel 15 is such that a layer of maximum channel conductivity is maintained adjacent to the instantaneous position of the depletion layer adjacent to the gate. The conductivity of channel 15 decreases radially away from gate 7. The inwardly directed flange 15*a* has alloyed or otherwise affixed thereto an annular ohmic contact comprising the source 16. The substrate 30 is utilized as the drain with the drain lead 19 attached thereto by any of the well known techniques. Inactivation of the outer surface 15*c* of channel 15 is obtained by epitaxially depositing a layer of semiconductor material 26 having the same polarity as that of the gate, i.e. N-type semiconductor, on the surface 15*c*, including the surface of outwardly directed flange 15*b*. The polar density of region 26 is of less magnitude than that of the gate. The gate lead 11 may be attached to the gate 7 in a manner described in connection with FIGURE 2. The gate 7 is positioned immediately adjacent the inturned flange 15*a***.

A conventional junction or bipolar transistor can be produced based on the aforementioned techniques or a device having a combination of the characteristics of both the field-effect and junction transistor can be made as described in the following. In regard to the former, the peripheral diffusion used to form the channel is stopped at the peripheral edge of the gate whereby a peripheral surface is formed comprising a channel element and a gate element. However, when the gate boundary is within the element forming the channel and below the peripheral surface thereof and such a device is under the influence of a retarding bias on the gate, field-effect conduction occurs through the channel and when such a device is under the influence of a forward bias of proper magnitude, minority-carrier control as experienced in conventional transistors is obtained. Therefore the device has some properties of each of the aforementioned types of transistors and a wider range of operation.

While I have shown and described several forms of my invention, it will be apparent to those skilled in the art that modification may be made therein without departing from the scope of my invention. Consequently, I do not wish to be restricted to the particular form or arrangement herein described and shown except as limited by my claims.

I claim:

1. A field-effect transistor comprising, in combination, a basic assembly consisting of a body of intrinsic semiconductor having two parallel major surfaces and a peripheral surface, a layer of one type of polar impurity formed in said body on one of said major surfaces and extending to said peripheral surface and forming a part thereof, a layer of single crystal semiconductor formed on the said layer of one type of polar impurity and also constituting a part of said peripheral surface, a channel in the form of an open annulus consisting of opposite type polar impurity formed in said basic assembly adjacent said peripheral surface, said channel extending along its longitudinal axis through the basic assembly in perpendicular relationship to said layer of one type polar impurity whereby said layer of one type polar impurity is divided providing a first gate extending inwardly of said peripheral surface to one side of said channel and a second gate in contact with the side of said channel opposite to said one side, said channel having a distribution of conductivity of maximum adjacent said first and second gates and diminishing in a direction toward the center of said channel from each of said gates, a source comprising an ohmic contact formed to one annular end of said channel, a drain comprising an ohmic contact formed to the opposite annular end of said channel, said gate positioned in the basic assembly immediately adjacent to said source.

2. A mesa-type field-effect transistor comprising, in combination, an assembly consisting of a low-resistivity substrate, a layer of intrinsic semiconductor grown on said substrate and having its maximum diameter less than the width of said substrate, a layer of one type of polar impurity diffused in said intrinsic conductor and forming a polarized surface thereon, and a layer of single crystal semiconductor grown on said polarized surface, said three layers forming an annular surface extending from said substrate, a layer of opposite type polar impurity epitaxially deposited on said annular surface having an inwardly directed flange embracing said layer of single crystal semiconductor and an outwardly directed flange formed on said substrate, said layer of opposite type polar impurity having a distribution of conductivity that is maximum adjacent said layer of one type polar impurity and diminishing radially therefrom, an annular electrode alloyed to said inwardly directed flange, and means for inactivating electrical noise in the surface of said layer of opposite impurity.

References Cited by the Examiner

UNITED STATES PATENTS

| | | | |
|---|---|---|---|
| 2,623,102 | 12/1952 | Shockley | 317—234 |
| 2,764,642 | 9/1956 | Shockley | 317—234 |
| 2,792,540 | 5/1957 | Pfann | 317—235 |
| 2,854,365 | 9/1958 | Matare | 317—235 |
| 2,919,388 | 12/1959 | Ross | 317—235 |
| 2,954,307 | 9/1960 | Shockley | 317—234 |
| 2,967,985 | 1/1961 | Shockley et al. | 317—234 |
| 2,979,427 | 4/1961 | Shockley | 317—234 |
| 3,007,119 | 10/1961 | Barditch | 317—234 |
| 3,028,655 | 4/1962 | Dacey et al. | 317—235 |
| 3,176,153 | 3/1965 | Bejat et al. | 317—234 |
| 3,208,002 | 9/1965 | Macdonald | 317—234 |

OTHER REFERENCES

Wireless World, "Transistors," by Roddam, page 544, November 1953.

JOHN W. HUCKERT, *Primary Examiner.*

J. D. CRAIG, *Assistant Examiner.*